United States Patent
Hamburgen et al.

[11] Patent Number: 6,138,748
[45] Date of Patent: *Oct. 31, 2000

[54] INTERLEAVED-FIN THERMAL CONNECTOR

[75] Inventors: William R. Hamburgen, Palo Alto; John S. Fitch, Newark; Robert A. Eustace, Redwood City, all of Calif.

[73] Assignee: Digital Equipment Corporation, Maynard, Mass.

[*] Notice: This patent is subject to a terminal disclaimer.

[21] Appl. No.: 08/970,450

[22] Filed: Nov. 14, 1997

Related U.S. Application Data

[63] Continuation of application No. 08/674,031, Jul. 1, 1996, Pat. No. 5,787,976.

[51] Int. Cl.⁷ .................................................. H05K 7/20
[52] U.S. Cl. .................. 165/185; 174/16.3; 257/722; 361/704; 165/80.3
[58] Field of Search .................. 165/80.3, 185; 174/16.3; 257/721, 722; 361/704, 707

[56] References Cited

U.S. PATENT DOCUMENTS

| | | | |
|---|---|---|---|
| 3,844,341 | 10/1974 | Bimshas, Jr. et al. | 165/185 X |
| 4,304,296 | 12/1981 | Shaffer | 165/185 X |
| 4,448,240 | 5/1984 | Sharon | 165/185 X |
| 4,770,242 | 9/1988 | Daikoku et al. | 165/185 |
| 4,800,956 | 1/1989 | Hamburgen | 165/185 |
| 5,083,373 | 1/1992 | Hamburgen | 29/890.03 |
| 5,515,912 | 5/1996 | Daikoku et al. | 165/185 X |
| 5,787,976 | 8/1998 | Hamburgen et al. | 165/185 |

FOREIGN PATENT DOCUMENTS

| | | | |
|---|---|---|---|
| 266857 | 11/1988 | Japan | 257/721 |
| 1112-445 | 3/1982 | Russian Federation | 257/722 |

OTHER PUBLICATIONS

IEEE, 1991, 0569–5503/91/0000–0693, "Hardware Technology for HITACHI M–880 Processor Group", F. Kobayashi t al [1991 Proceedings of the 41st Electronic Components & Technology Conference, Atlanta, Georgia], pp. i–13.

"Interleaved Fin Thermal Connectors for Multichip Modules", W. Hamburgen, WRL Research Report 91/9 Aug. 1991, Digital Equipment Corporation, Western Research Lab, 250 University Ave., Palo Alto, California 94301 USA, pp. 1–8.

Chemical Etching and Slice Cleanup, Standard (110) Projection for Silicon (Face–Centered Cubic) Crystal Showing Rhombic Pattern Alignment with the 90 (111) Traces, p. 1.

*Primary Examiner*—Leonard Leo
*Attorney, Agent, or Firm*—Jenkens & Gilchrist, a Professional Corporation

[57] ABSTRACT

In order to provide a thermal coupling between a heat source and a heat sink, an interleaved-fin connector is provided. The connector comprises first and second substrates. The first substrate includes a first surface. A plurality of first channels are etched on the first surface to form a plurality of first fins and a first base. The first base can be thermally engaged with the heat source. The second substrate includes a second surface having a plurality of second channels etched therein. The second channels form a plurality of second fins and a second base. The second base can be thermally engaged with the heat sink. The first and second fins providing a thermally conductive path from the heat source to the heat sink when interleaved with each other.

17 Claims, 11 Drawing Sheets

INTERLEAVED-FIN THERMAL CONNECTOR

This application is a continuation of application Ser. No. 08/674,031 filed on Jul. 1, 1996, now U.S. Pat. No. 5,787,976.

FIELD OF THE INVENTION

This invention relates generally to cooling components, and more particularly to thermally coupling heat sources to heat sinks.

BACKGROUND OF THE INVENTION

It is a problem to remove heat from systems using densely packed, high-power devices. Many prior art systems use convection cooling to remove heat. To work efficiently, systems cooled by convection currents require means, such as fans or pumps, to move large amounts of a cooling fluid across the heat generating devices. This makes convection cooling inappropriate for compact low-profile portable computer systems equipped with high-speed CPU chips.

In compact systems, heat sinks are typically connected to the heat generating devices so that the heat can be conducted, instead of convected away. Frequently it is desired to construct the system so that the heat sink and the heat generating device can be decoupled. This makes servicing, repairing, and replacing of the heat generating devices easy.

In addition, it is also desired to reduce stress at the thermal connection. The stress can be caused by differences in thermal expansion rates of the heat generating and removal components. Furthermore, in order to construct slim portable systems, the total vertical height of component assemblies must be maintained at a minimum.

In the prior art, interleaved-fin thermal connectors have been used to provide a thermal conductive path between the heat generating device and the heat removal mechanism. For example, U.S. Pat. No. 4,800,956, "Apparatus and Method for Removal of Heat from Packaged Element", and U.S. Pat. No. 5,083,373 "Method for Providing a Thermal Transfer Device for the Removal of Heat from Packaged Elements" describe thermal transfer assemblies including two sets of cooling fins. The fins can be interleaved with each other to provide a detachable thermal connection.

There are several problems with these prior art thermal connectors. First, the assembly of the elements requires several steps which do not readily admit automation. For example, the fabrication of the prior art interleaved devices requires a tape material to hold the fins in place during assembly. For example, the tape is intertwined between the fins. Next, the fins can be forced against a base plate by a jig. While held in this position, the fins can be joined to the base plate using solder. Once the fins are fixed to the base, the tape can be removed.

Second, the prior art fins and bases are made of heat conducting metals, for example, copper or specially prepared aluminum. These metals are well suited for fabrication and soldering of large scale components. However, it would be extremely difficult to make copper or prepared aluminum fins having a vertical height in the range of millimeters or less, and widths measured in terms of microns.

Even if rigid small fins and bases could be constructed, connecting the metallic fins and bases would be extremely difficult using the jigged tape and soldering methods described above. Such methods are not suited for low-cost mass production techniques.

Third, there may be differences between thermal expansion rates of the semiconductor devices and the fins and bases of the prior art assemblies. These differences would stress the joint where the assemblies are attached, leading to possible failures.

Therefore, it is desired to provide an easily detachable thermal connector having a small vertical dimension and which can be fabricated from readily available material using mass production techniques. In addition, it is desired that the thermal connector have freedom of movement in a maximum number of different directions.

SUMMARY OF THE INVENTION

In order to provide a conductive thermal coupling between a heat source and a heat sink, an interleaved-fin connector is provided. The connector comprises first and second etchable substrates. The first substrate includes a first surface. A plurality of first channels are etched on the first surface to form a plurality of first fins and a first base. The first base can be thermally engaged with the heat source.

The second substrate includes a second surface having a plurality of second channels etched therein. The second channels form a plurality of second fins and a second base. The second base can be thermally engaged with the heat sink. The first and second fins provide a thermally conductive path from the heat source to the heat sink when interleaved with each other.

In a preferred embodiment, the substrates are anisotropically etchable. For example, the substrates can be crystals, e.g., silicon based semiconductor substrates, polycrystals, amorphous glass, or ceramics. Furthermore, the channels are preferably wet etched at an angle which is substantially perpendicular to surfaces of the substrates. Alternatively, the channels can be dry etched using plasma or reactive ion anisotropic etching techniques. In one aspect of the invention, the first and second fins are planar and parallel to each other. In another aspect of the invention, the first and second fins are concentric and cylindrical.

DETAILED DESCRIPTION OF PREFERRED EMBODIMENT

Figure 1:
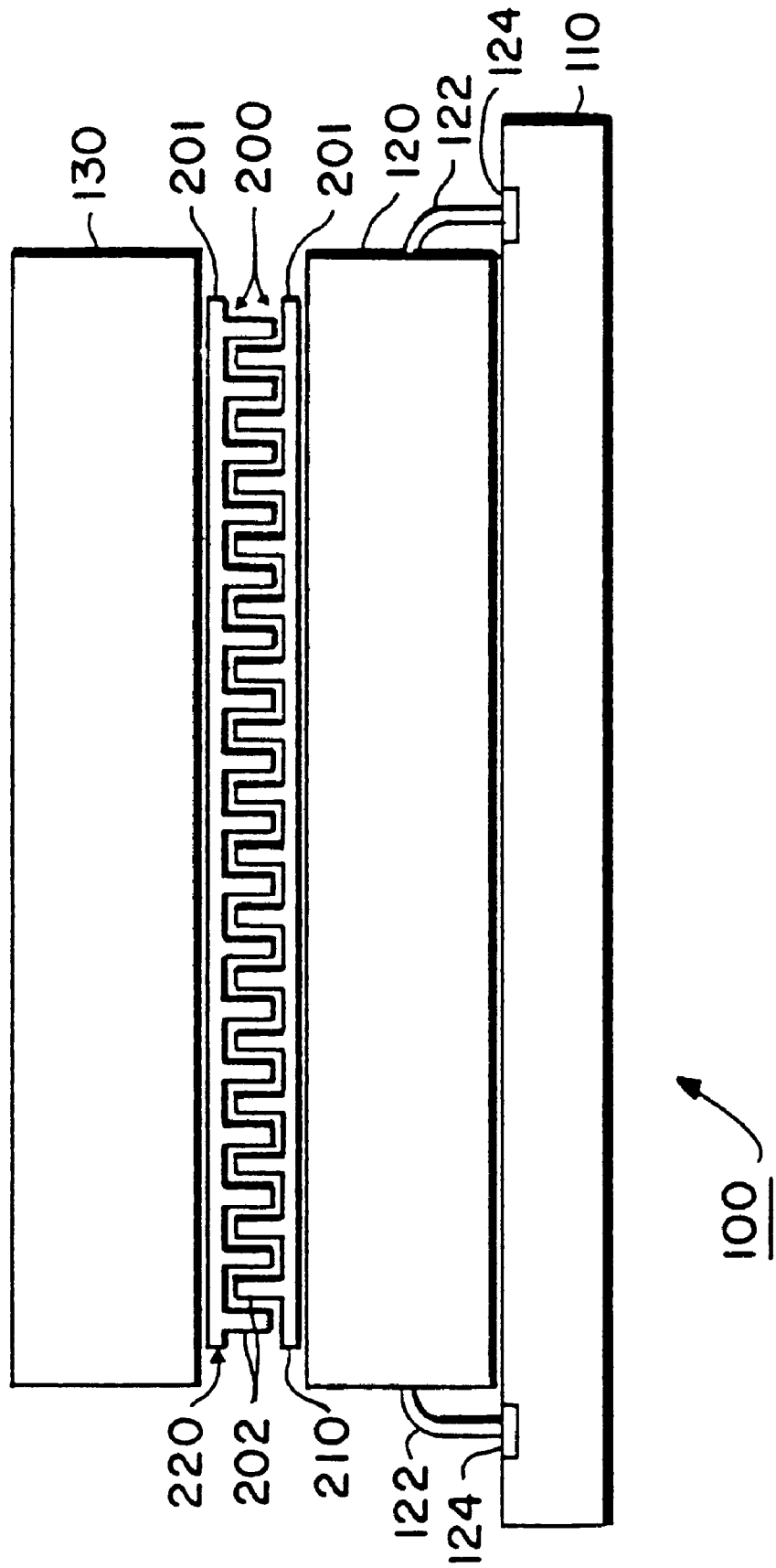
FIG. 1 is an end view of an arrangement including an interleaved-fin thermal connector according to a preferred embodiment of the invention.

Now with reference to the drawings, etched low-profile interleaved-fin thermal connectors according to preferred embodiments of the invention are described. As shown in an arrangement 100 of FIG. 1, mounted on a printed circuit board (PCB) 110 is a heat source, for example, an electrically powered semiconductor device 120. Leads 122 of the device 120 are electrically connected to circuit traces 124 formed on, or in the PCB 110.

During operation of the device 120, electrical currents conducted by the leads 122 to the device 120 generate heat in the device 120. This heat must be removed to ensure reliable operation of the device 120. The heat can be removed via a cold plate 130. The cold plate 130 can be part of a heat sink, or any other conventional heat removal mechanism.

It is desired that the semiconductor device 120 be thermally coupled to the cold plate 130. Furthermore, it is desired that the thermally conductive path between the heat source 120 and the heat sink 130 be non-permanent. Having a non-permanent thermal coupling between the device 120 and the plate 130 facilitates the repair and replacement of the device 120 in case of failure of the device 120, or upgrade to a higher performance device.

In addition, it is desired that the thermal connection be low-profile, and low stress. Having a low profile implies that the means for connecting does not substantially increase the vertical distance between the cold plate 130 and the device 120. For example, it is desired that the separation between the device 120 and the cold plate 130 be in the order of a couple of millimeters, or less. This would allow for the assembly of low-profile packages such as slim portable or palm-top computers.

Low stress minimizes the likelihood of failure of the thermal connection due to differences in heat induced expansion rates. Furthermore, it is desired that the connector can easily be manufactured using high volume, low cost fabrication techniques.

Therefore, according to the principles of the invention, the thermal coupling is provided by an interleaved-fin thermal connector 200. The connector 200 includes a first or lower element 210, and a second or upper element 220. Each of the elements 210 and 220 includes a base portion 201, and a plurality of heat transfer fins 202. During operation of thermal connector 200, the first element 210 of the connector 200 is thermally engaged with the device 120, and the second element 220 is likewise thermally engaged with the cold plate 130. The thermally conductive path is completed by interleaving the fins 202 of the two elements.

According to the invention, each of the connector elements 210 and 220 is fabricated from an etchable substrate. For example, the substrates can be crystals, e.g., silicon based semiconductor substrates, polycrystals, amorphous glass, or ceramics. Preferably, the fins are formed in the substrate using either wet or dry anisotropic etching techniques.

The starting material for the substrates 210 and 220 can be a crystal of silicon grown as an ingot. Crystals are characterized by the periodic arrangement of atoms in a regularized lattice. The lattice of a silicon crystal, for example, can be represented as two interpenetrating face-centered cubic lattices. The planes of the cubic lattices typically are described by sets of three integers called the Miller indices, e.g., {100}, {111}, and {110} etc., see R. A. Latakia, *The Growth of Single Crystals*, Prentice Hall, 1970.

The crystal's growth is strongly ordered along the "faces" of the lattice. Because of this, the strength of the bonds between co-planar atoms is many orders of magnitude greater than bonds among atoms lying in adjacent planes. This natural phenomena, exploited by the invention, leads to what are commonly known as cleavage planes.

Figure 2:
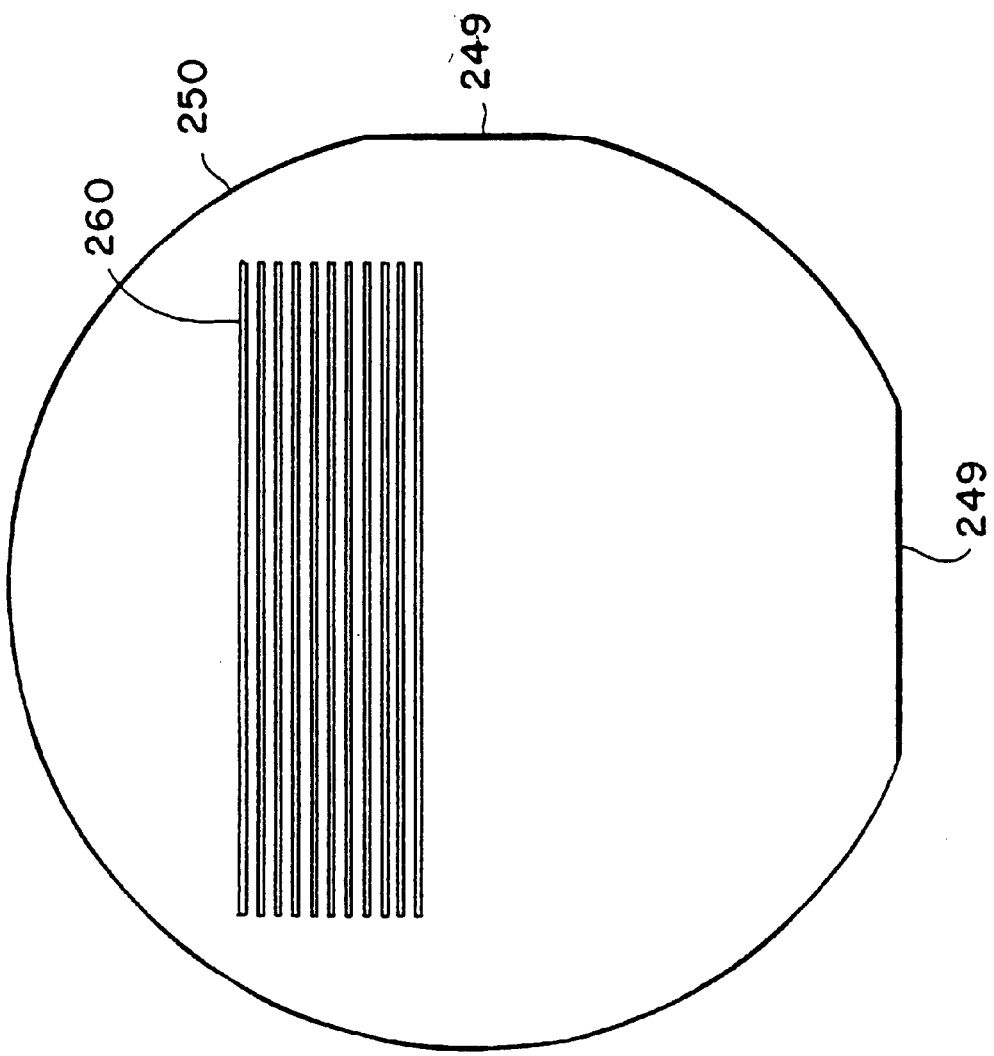
FIG. 2 is a planar view of a silicon wafer used to form the substrates of thermal connector of FIG. 1.

Normally, single crystal silicon wafers are commercially available with {110} orientation of the planes of the faces, or less frequently with {110} orientation. Depending on the particular arrangement of the fins 202 desired and the etching technique, various other orientations can be used, as described below As shown in FIG. 2, a wafer 250 is sliced from the silicon ingot to the desired thickness. In the preferred embodiment of a low-profile connector, the finished wafers 250, after slicing and polishing, have a thickness in the range of 0.5 to 1.0 millimeter for four inch standard diameter wafers. However, the invention can also be worked with wafers having other sizes. Flat edges 249 can be ground on the wafer to indicate the orientations of the lattice planes of the crystal.

Figure 3:
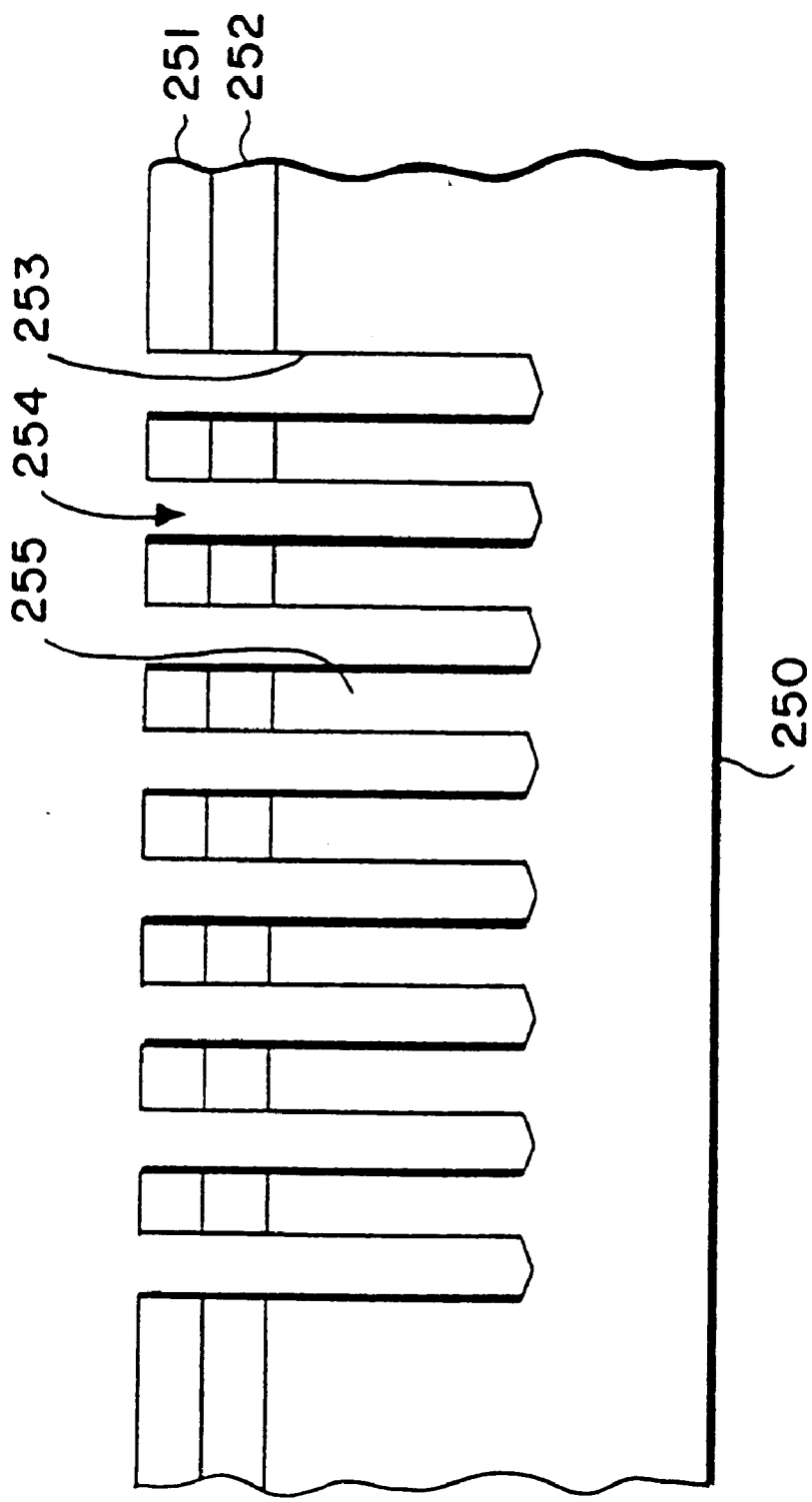
FIG. 3 is an end view of the wafer of FIG. 2 having etched fins.

Now, also with reference to FIG. 3, the preparation and processing of the wafer 250 is described in greater detail. First, some combination of elevated temperature, air, steam, sputtering, or other depositing processes can be used to form a thin silicon dioxide ($SiO_2$) layer 252 on the wafer 250. The $SiO_2$ provides a stable protective film on the outside of the wafer. Next, a photo-resist layer 251 is applied on the oxide layer 252.

A mask, not shown, determines the desired pattern of the fins to be formed in the wafer 250, for example, the partial pattern 260 shown greatly enlarged in FIG. 2. For silicon with the {110} orientation, the pattern 260 is substantially aligned with one of the {111} cleavage planes of the lattice which perpendicularly intersects the surface of the wafer 250. The orientation of one such plane is generally indicated by the longest flat edge 249 ground on the otherwise circular wafer 250.

Photo-lithography can be used to transfer the pattern of the mask to the photo-resist layer 251. In the case of wafers having a {110} orientation, the pattern of the fins 202 can be formed on one or both sides of the wafer 250. The exposed mask is further developed and processed to remove the mask in areas where the pattern is to be etched.

Next, the exposed wafer is immersed in a bath of hydrofluoric acid to remove the protective oxide layer 252 in the exposed area of the photo-resist layer 251. After the oxide layer has been selectively removed to expose the pattern on the silicon, the rest of the mask layer 251 can be stripped.

The channels which separate the fins can be formed in the wafer 250 using anisotropic etching techniques. For example, in a wet etching technique, the wafer 250 is simply bathed in a heated solution of potassium hydride (KOH). With anisotropic etching, the etching proceeds substantially uni-directionally to form the channels.

As shown in FIG. 3, the anisotropic etching yields substantially vertical walls 253 of channels 254, except in the deepest portion. The channels 254 are etched into the wafer 250 in the areas where the silicon dioxide has been removed. As an advantage of the invention, aligning the pattern 260 with the perpendicularly oriented {111} lattice planes yields deep and narrow channels. The rate of etching in the vertical direction is several hundred times the rate of etching in the horizontal direction.

The unetched portions 255 of the wafer 250 form the fins 202 of FIG. 1. The depth of the channels 254 can be controlled by the length of time that the wafer 250 is immersed in the KOH etching solution. The width of the alternating fins and channels can be in the range of, for example, 50 to 100 microns. Once the wafer 250 has been etched, the substrates can be cut out of the wafer to appropriate sizes.

In the case of wafers having other orientations of cleavage planes, or in the case of substrates made of polycrystals, glass or ceramics, the fins 202 can be formed using plasma or reactive ion dry etching techniques. In plasma etching, a glow discharge is utilized in a partial vacuum to produce chemically reactive species, e.g., atoms, radicals, or ions, from a relatively inert gas. The gas, for example, fluorine ($CF_4$), is selected to react with the substrate. It may be necessary to use chemical vapor deposition techniques to form a more resistant nitride protective layer on the outside of the wafer for plasma etching techniques since dry etching tends to be more corrosive than the KOH used in the wet etching described above.

As disadvantages, dry etching requires a complex reactor, and it is more difficult to produce deep vertical channels. However, as an advantage with dry etching, the pattern of the mask does not necessarily need to align with the cleavage planes of the crystal. Therefore, it is possible to have arrangements other than parallel planar fins.

Figure 4:
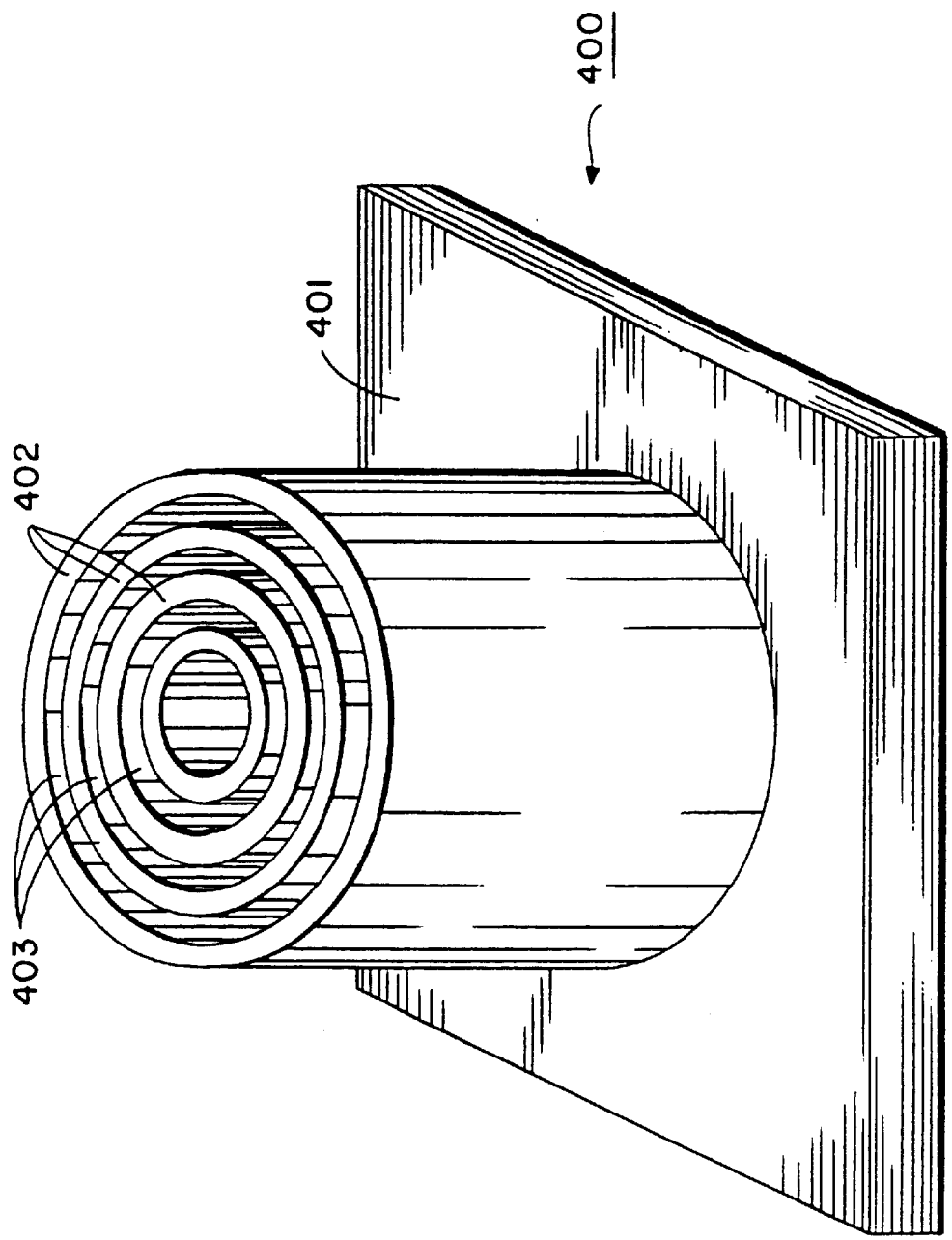
FIG. 4 is a perspective view of cylindrical fins.

For example, FIG. 4 shows a lower element 400 including a base 401 and a plurality of concentric fins 402 and channels 403 formed thereon by plasma or reactive ion etching. The channels of a mating upper element, not shown, would be etched to align with the fins 402 of the lower element 400. By placing the fins in a concentric pattern, the upper and lower elements can rotate, as well as accommodate relative vertical displacement with respect to each other.

Figure 5:
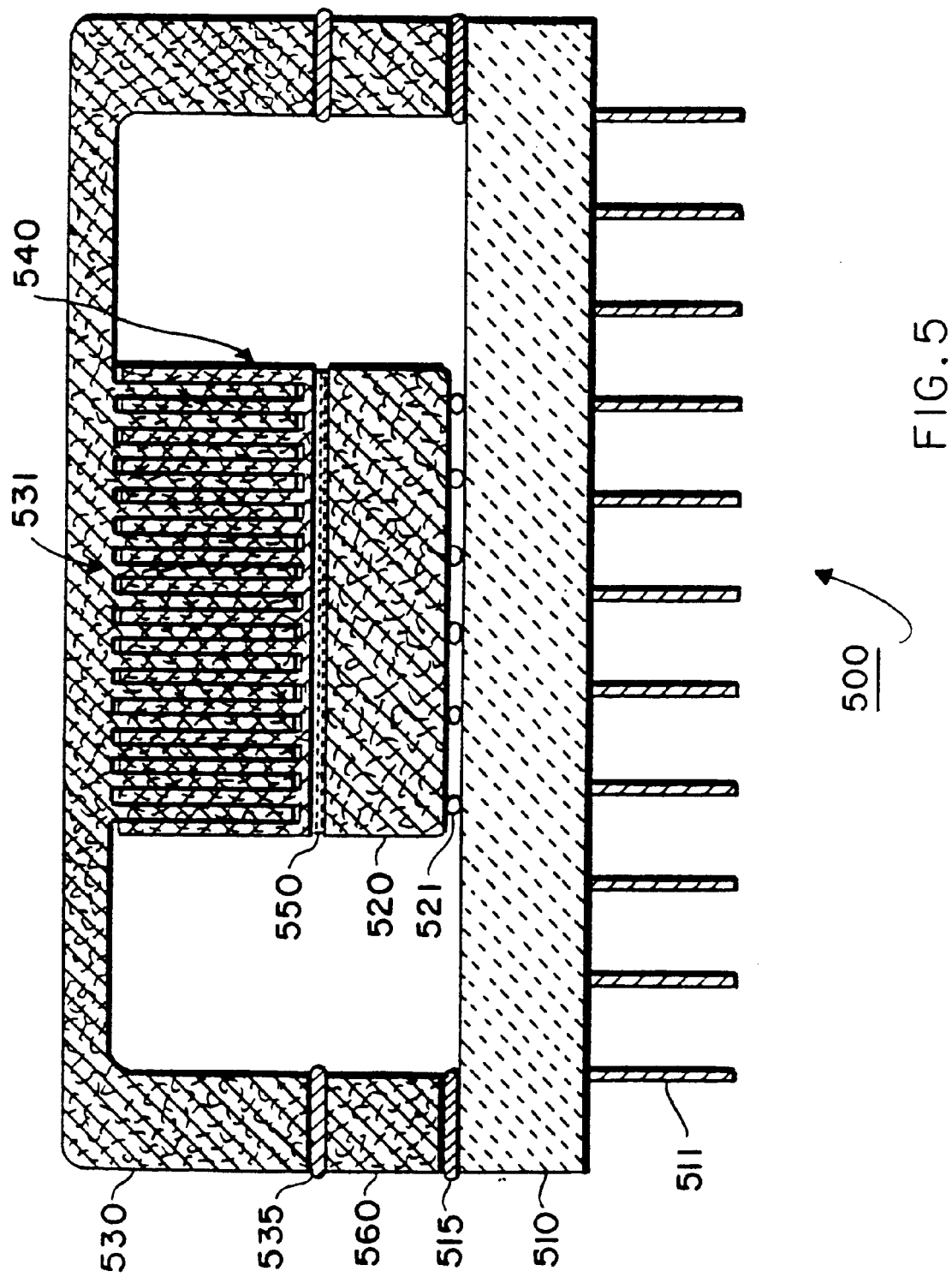
FIG. 5 is a cross-sectional view of a semiconductor package using interleaving fins.

As shown in FIG. 5 the interleaved-fin thermal connector according to the invention can be used to construct a hermetically sealed semiconductor package 500. A package base 510 includes a plurality of pins 511 for connecting to circuits of a printed circuit board, not shown. Mounted on the base 510 is a semiconductor die 520. The active circuits of the die 520 are connected to the pins 511 via electrically conductive bonds 521.

A lid 530 is formed of an etchable substrate. The lid 530 includes fins and channels 531 formed on an inner surface according to the anisotropic etching techniques described herein. A mating semiconductor connector 540 has fins and channels formed in a side surface facing the lid 530. The back side of the mating connector 540 is connected to the die 520 by a thermally conductive bond 550. A seal ring 560 connects the lid 530 to the base 510. The seal ring 560 can be made of a ferrous alloy or ceramic having a controlled coefficient of thermal expansion which minimizes thermal stresses between the lid 530 and base 510 during assembly and operational cycles. A lid seal 535 can be made of a tin-gold, lead-tin, or gold-silicon alloy. A brazed joint 515 can connect the seal ring 560 to the base 510. During operation of the package 500, a heat sink can be placed in contact with the lid 530.

Figure 6A:
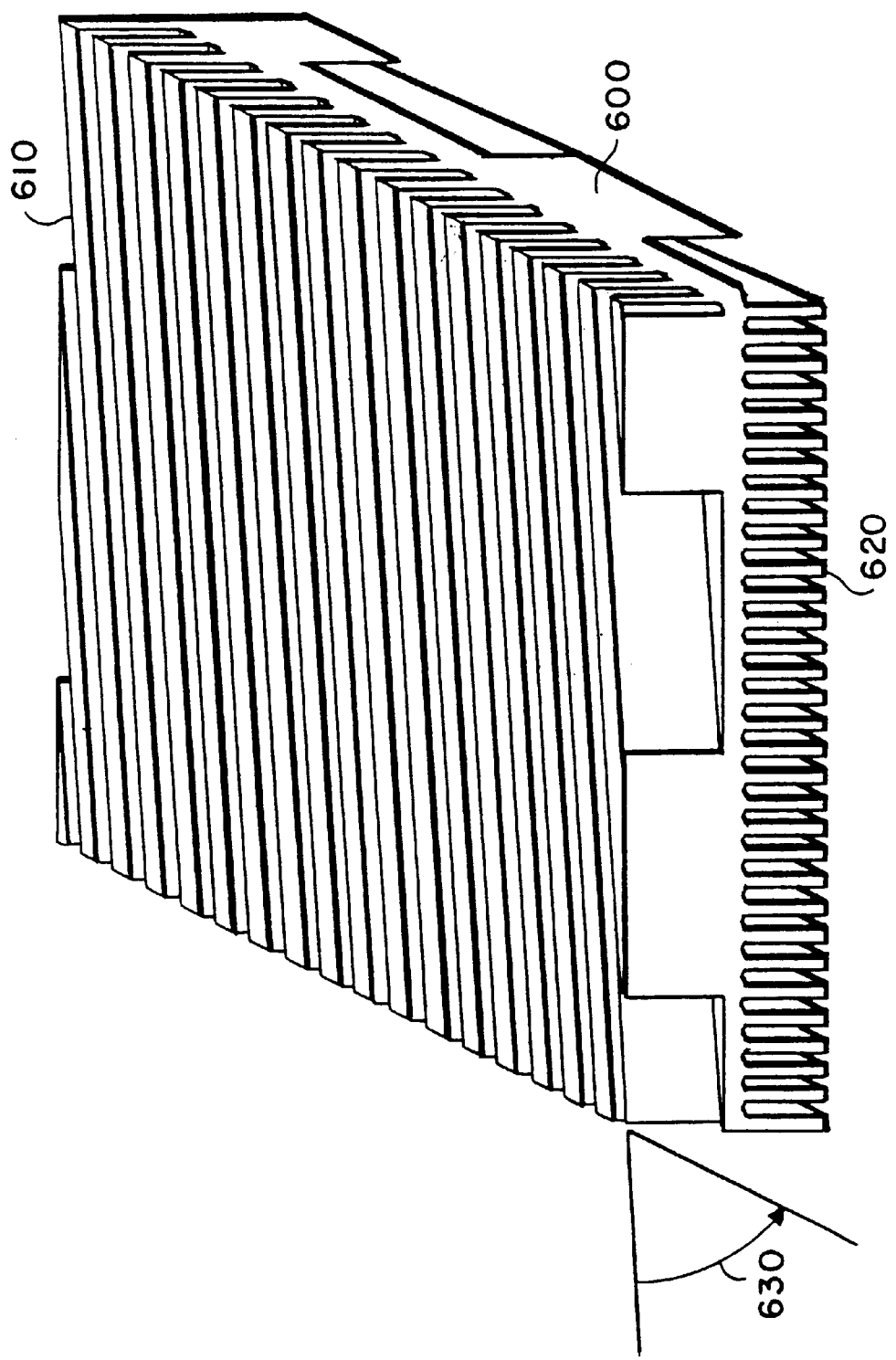
FIG. 6A is a perspective view of a substrate having fins formed on both sides.
Figure 6B:
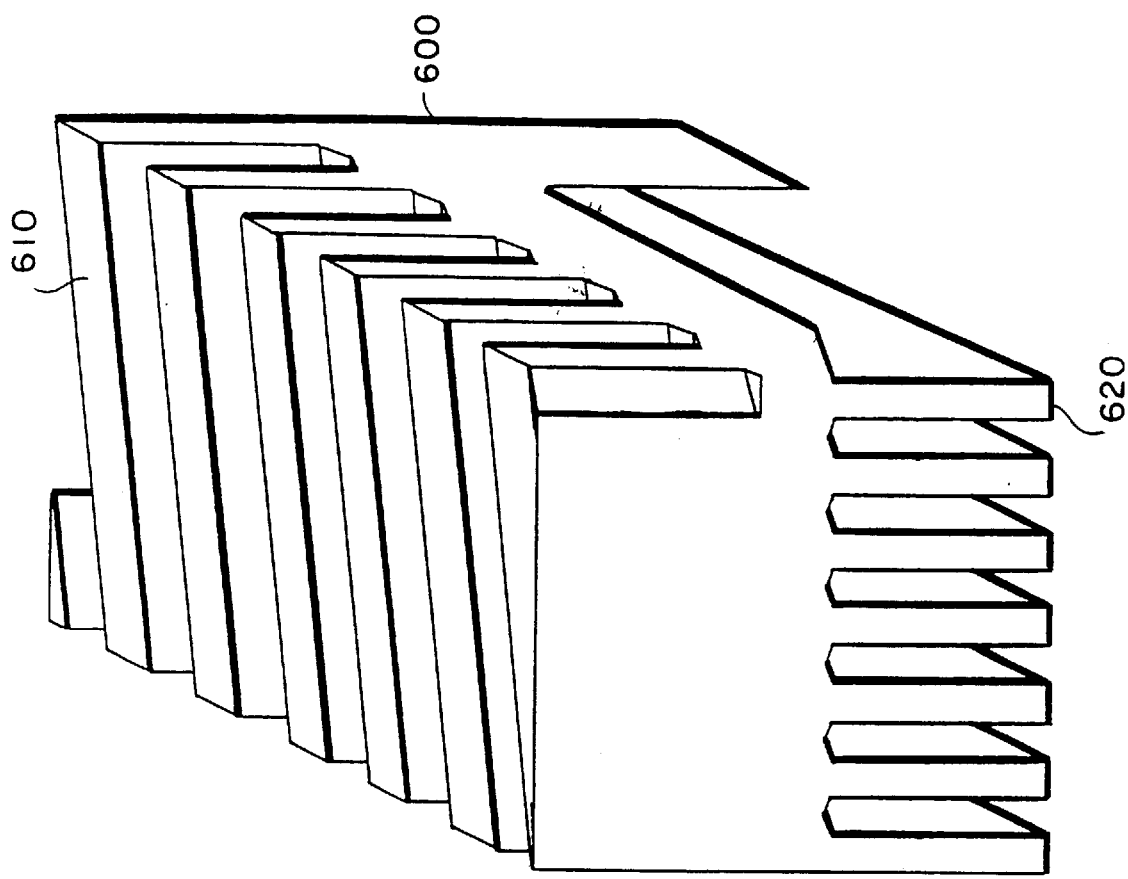
FIG. 6B is an enlargement of a corner portion of the substrate of FIG. 6A.

FIGS. 6A and 6B show a middle element 600 of a three element interleaved thermal connector to provide five degrees of freedom between heat generating and heat removal devices. The lower and upper elements coupling with the middle element 600 can be as shown in FIG. 1. The upper fins 610 and lower fins 620 of the element 600 are etched on opposing sides of the crystal, e.g., the wafer 250 of FIG. 2. Note that the angle 630 between the lower and upper channels and fins is substantially equal to the angle of two {111} cleavage planes of the {110} crystal lattice of silicon, about 70.52°. To make the channels and fins be almost aligned with the sides of the element 600, both sets of fins can be etched at an angle of 09.74° with respect to the sides of the element 600.

The elements of FIGS. 1, 4, and 6A or 6B can be combined to realize a "universal" thermal coupling having six degrees of freedom. In addition, the thickness of the fins can be varied to provide greater heat conductivity in areas where the thermal flux is higher.

Figure 7A:
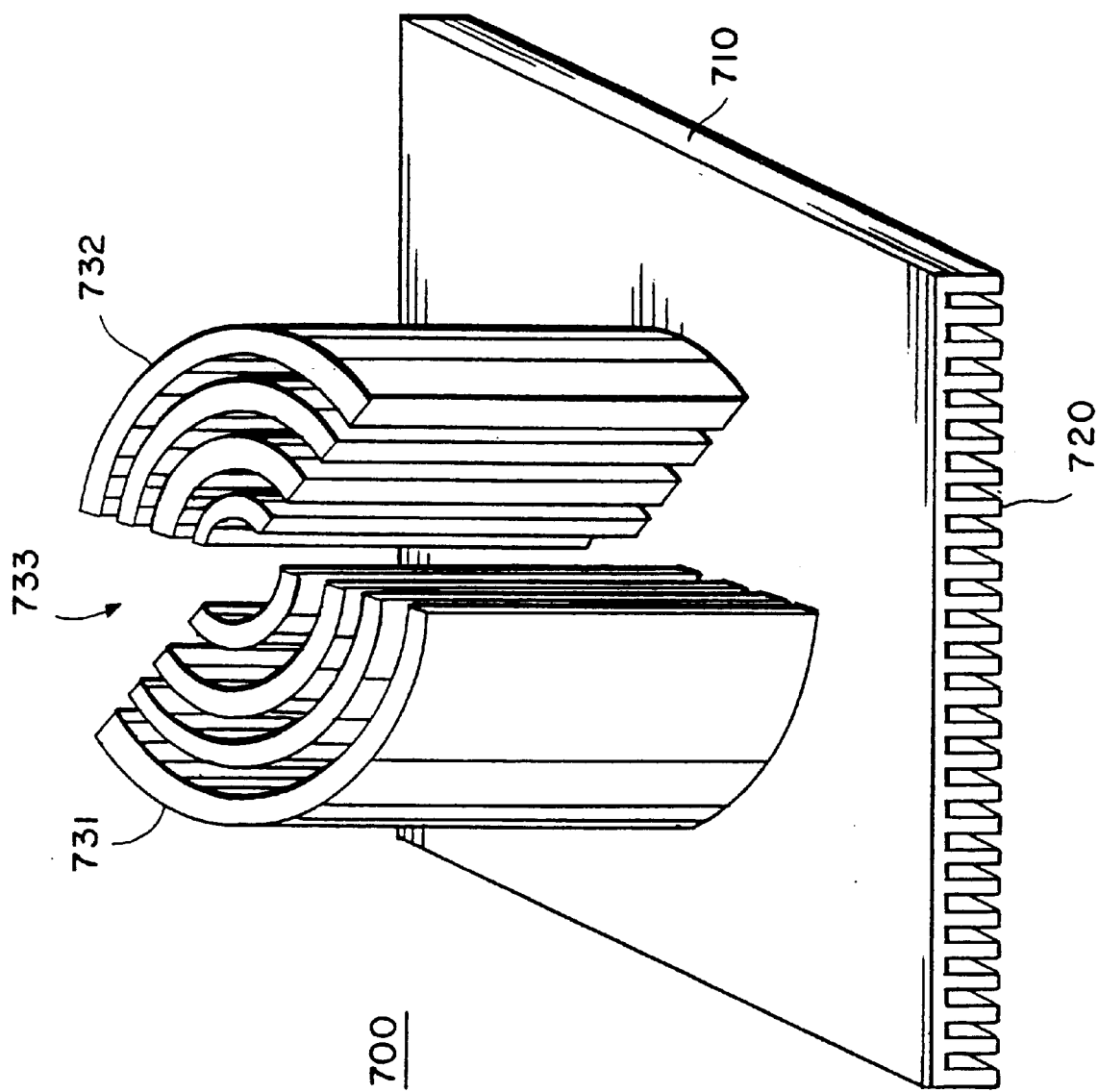
FIG. 7A is a perspective view of a substrate having self-mating fins.
Figure 7B:
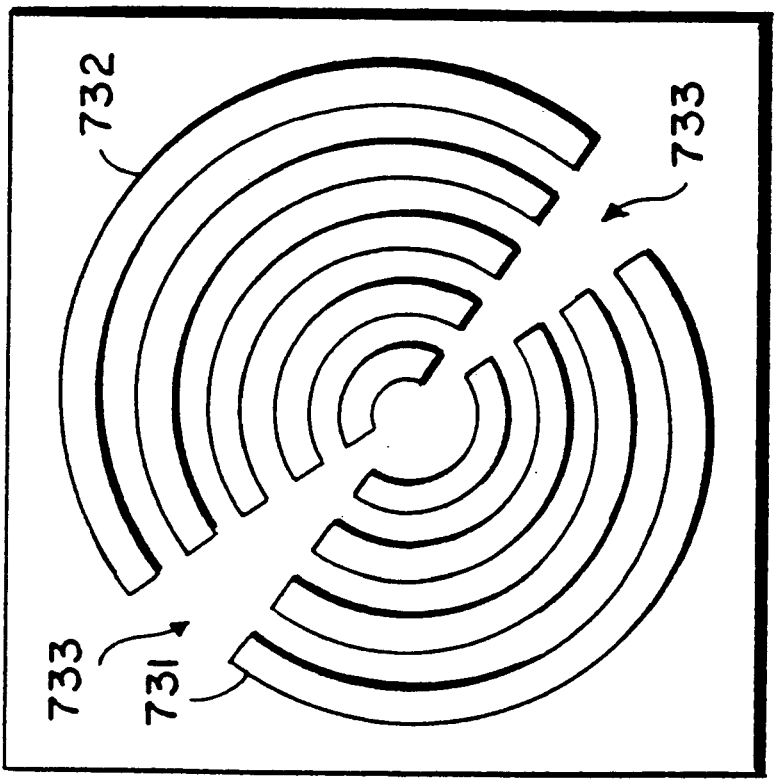
FIG. 7B is a top view of the substrate of FIG. 7A.
Figure 7C:
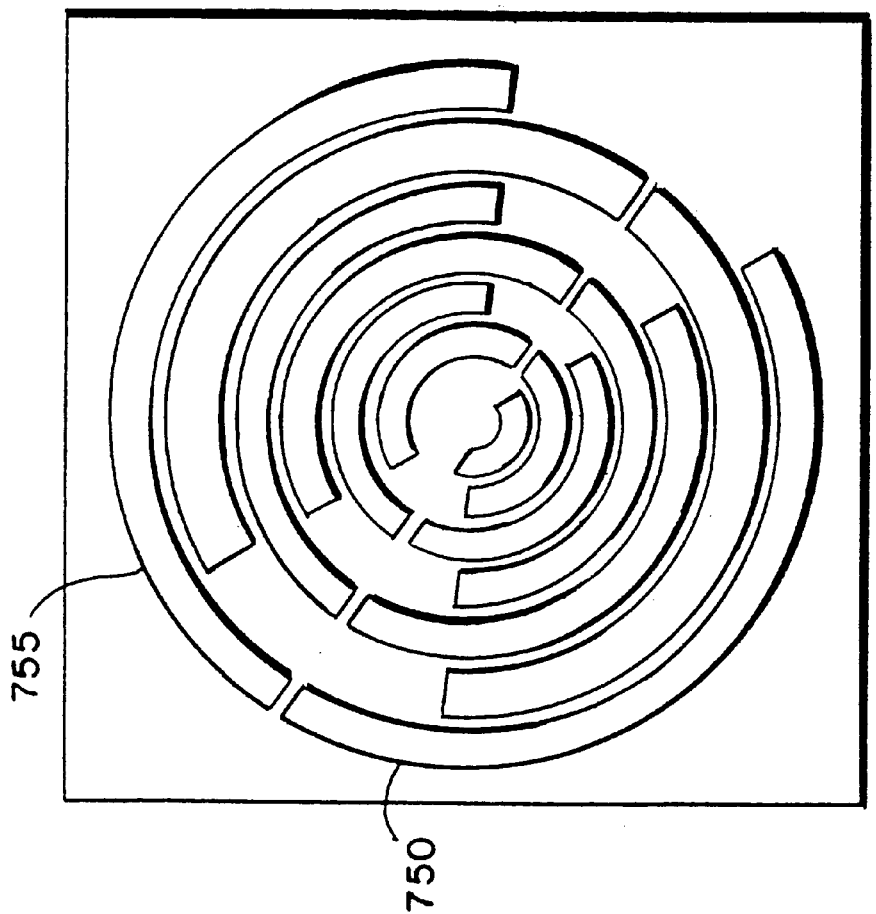
FIG. 7C is a sectional view of two identical parts as shown in FIG. 7A mated.

FIGS. 7A, 7B and 7C show a variation of the elements shown in FIGS. 1 and 4. The element 700 includes a base 710 having straight channels and fins 720 formed on one side. The other side has concentric curved fins and channels. The fins and channels of a first segment 731 are off-set or staggered from the fins and channels of a second segment 732.

V-shaped cut-outs 733 separate the two segments 731–732. The V-shaped cut-outs 733 are along the axis of concentricity. The centerline of the V-shaped cut-outs 733 is at 45° respective to the fins and channels 720 on the opposing side of the substrate. The angle of the V-shaped cut-outs can be about 5 to 30 degrees.

As shown in FIG. 7C, a first part 750 (vertical hatching) and a second part 755 (horizontal hatching) of the same design can mate with each other. By having V-shaped cut-outs 733 in the arrangement of concentric fins, the parts can still rotate with respect to each other over a limited range. The amount of rotation can be controlled by the size of the angle of the V-shaped cut-outs 733. Centering the V-shaped cutouts 733 at a 45° angle to the base 710, allows the mating of identical parts so that their respective fins 720 of their bases are at a 90° angle to each other, as generally indicated by the orientation of the hatching. This is a useful universal coupling component.

Figure 8:
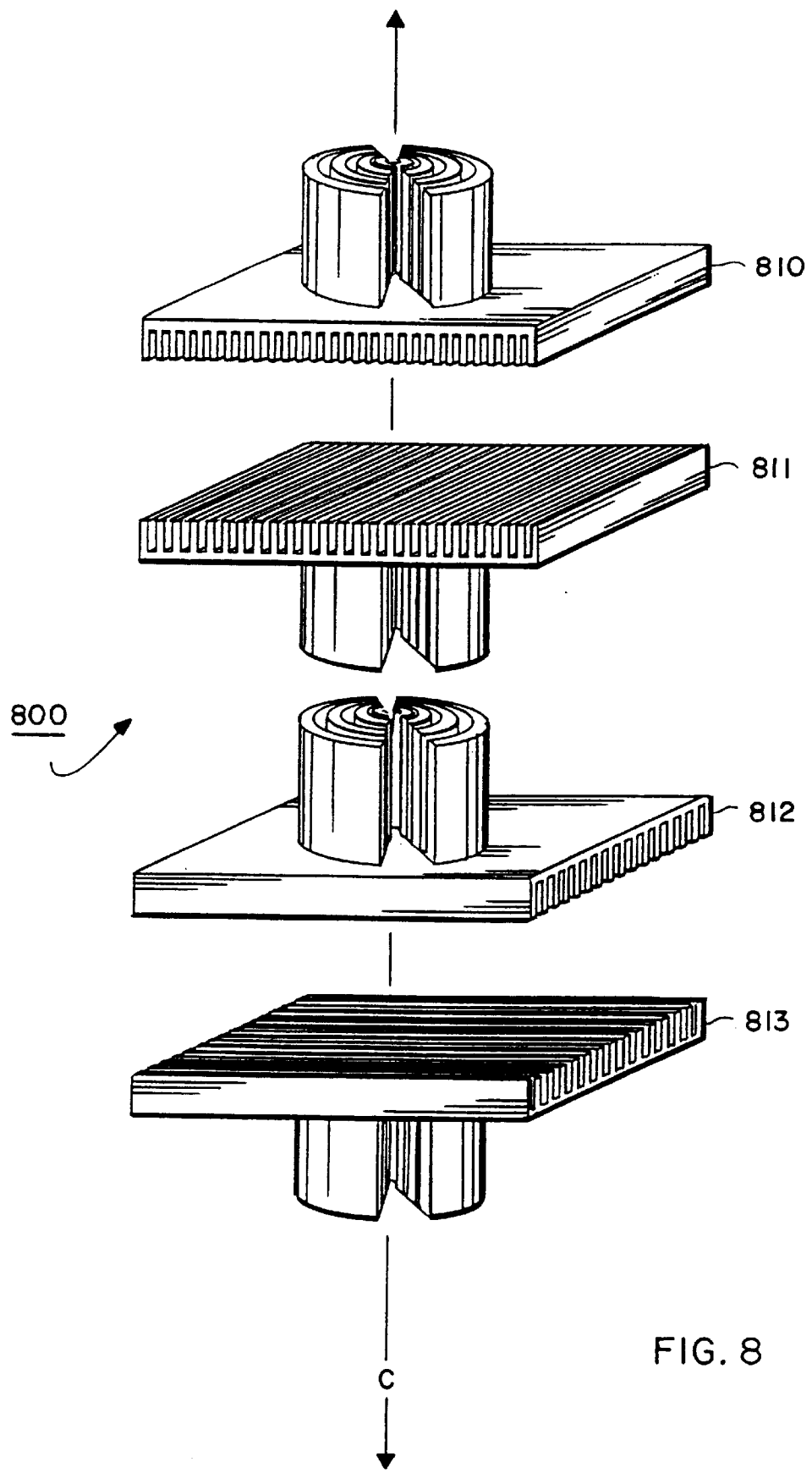
FIG. 8 is an exploded perspective view of interleaved fins having multiple degrees of freedom of movement.

FIG. 8 shows how multiple interleaved fins of several identical elements 700 can be engaged with each other to attain a thermal joint having a full six degrees of freedom of movement. The arrangement 800 includes elements 810–813. Each of the elements 810–813 can be like the elements of FIG. 7. Because the V-cuts are along the diagonal, the straight fins of the pair 810–811 are at right angle to the straight fins of the pair 812–813. This arrangement allows freedom of movement in all directions over a limited range.

Specific implementations of the invention have been described with respect to a heat connector for conducting heat from electronic semiconductor devices. However, the invention can also be used with other small-sized heat generating devices. For example, recently it has become possible to form electro-mechanical devices in silicon. As the power of these miniature mechanical devices increases, so will their thermal output. Those familiar with the art will appreciate that it may be practiced in other ways while still remaining within the scope and spirit of the appended claims.

What is claimed is:

1. An apparatus for thermally coupling a heat source to a heat sink, comprising:

a first substrate including a first surface having a plurality of first channels formed therein to form a plurality of first fins and a first base to thermally engage the heat source; and a second substrate including a second surface having a plurality of second channels formed therein to form a plurality of second fins and a second base to thermally engage the heat sink, the first and second fins providing a thermally conductive path from the heat source to the heat sink when interleaved with each other;

wherein said first and second fins are cylindrical, and are concentric when interleaved with each other, and also wherein said substrates include cut-out portions for permitting limited relative rotational movement between said first and second fins when said first and second fins are interleaved with each other, within a relative rotational movement range that is limited by said cut-out portions.

2. The apparatus of claim 1 wherein the first and second substrates are made of a silicon crystal.

3. The apparatus of claim 2, wherein the silicon crystal is a single crystal silicon.

4. The apparatus of claim 3, wherein the single crystal silicon has an {110} orientation and at least one of the first and second channels coincide with a {111} plane of the single crystal silicon.

5. The apparatus of claim 1 wherein the first and second substrates are made of a polycrystal.

6. The apparatus of claim 1 further comprising:
   a third substrate having opposing first and second side surfaces, a plurality of etched third channels formed in the first side surface to form a plurality of etched third fins, and a plurality of etched fourth channels formed in the second side surface to form a plurality of fourth fins, the third substrate to thermally the first and second substrates.

7. The apparatus of claim 6, wherein the third channels are angled with respect to the fourth channels in a non-orthogonal configuration.

8. The apparatus of claim 1, wherein at least one of the first and second channels is one of anisotropically etched and wet etched.

9. The apparatus of claim 1, wherein at least one of the first and second channels is dry etched.

10. The apparatus of claim 9 wherein the dry etching uses plasma.

11. The apparatus of claim 20, wherein the dry etching as performed using reactive ions.

12. The apparatus of claim 1, further comprising a plurality of third substrates, each third substrate having opposing first and second side surfaces, a plurality of etched third channels formed in the first side surface to form a plurality of third fins, and a plurality of etched fourth channels formed in the second side surface to form a plurality of fourth fins, the plurality of third substrates coupled together and thermally coupled to the first and second substrates to achieve at least six degrees of freedom.

13. The apparatus of claim 1, wherein the first and second channels are aligned along lattice cleavage planes of the respective first and second substrates.

14. The apparatus of claim 1, wherein the first and second channels are formed in a portion of the respective first and second substrates.

15. A thermal joint apparatus, comprising:
   a first substrate including a plurality of first channels formed therein to form a plurality of first fins and a first base thermally engaged with a heat source;
   a second substrate including a plurality of second channels formed therein to form a plurality of second fins and a second base for thermally engaging a heat sink; and
   a third substrate including a plurality of third channels formed therein to form a plurality of third fins, some of said third fins being for interleaving with some of said first fins, others of said third fins being for interleaving with some of said second fins, each of said pluralities of first, second and third fins respectively including both concentric cylindrical fins and planar fins, so as to permit desired degrees of freedom of relative movement among said substrates to be achieved.

16. The apparatus of claim 15 wherein said others of said third fins and said some of said second fins are planar and parallel when interleaved with each other.

17. The apparatus of claim 15 further comprising a fourth substrate including a plurality of fourth fins including both cylindrical and planar fins, certain of said fourth fins are for being interleaved with remaining fins of one of said pluralities of first and second fins, and said first, second, third, and fourth fins are configured to permit said substrates to have six degrees of freedom of movement relative to each other.

* * * * *